United States Patent [19]

Kim

[11] Patent Number: 5,565,989
[45] Date of Patent: Oct. 15, 1996

[54] PHOTORECEIVER HAVING MULTIPLE FUNCTIONS

[75] Inventor: Sang-Cheol Kim, Kyounggi-do, Rep. of Korea

[73] Assignee: Samsung Aerospace Industries, Ltd., Kyeongsangnam-do, Rep. of Korea

[21] Appl. No.: 517,416

[22] Filed: Aug. 21, 1995

[30] Foreign Application Priority Data

Aug. 24, 1994 [KR] Rep. of Korea ............... 94-20932

[51] Int. Cl.$^6$ ............................................. G01B 11/00
[52] U.S. Cl. .................. 356/401; 356/400; 250/548
[58] Field of Search ............................ 356/399, 400, 356/401, 363; 250/548

[56] References Cited

U.S. PATENT DOCUMENTS 4,540,277  9/1985  Mayer et al. ..................... 356/401

Primary Examiner—Frank Gonzalez
Assistant Examiner—Robert Kim
Attorney, Agent, or Firm—Finnegan, Henderson, Farabow, Garrett & Dunner, L.L.P.

[57] ABSTRACT

The present invention relates to a light-exposure assembly. It includes a mask which is placed on a mask stage to accept exposed light. A work-piece stage is placed under the mask stage. A projection lens is placed in between the mask stage and the work-piece stage to form an image on the work-piece stage by accepting the exposed light. A first mark is carved on the mask to detect the parallel-degree of movement of the mask stage and the work-piece stage. A second mark is carved on the mask to measure changes in magnification of a projection lens by moving together the above first mark. A third mark is carved on the mask to determine focus point of the projection lens. A fourth mark is carved on the work-piece stage to assist the first and second marks. A first optical detecting part is placed on the work-piece stage, on which a fourth mark is carved to assist the movement of the first and second marks, and to detect the exposed light. A second optical detecting part is placed on the above work-piece stage to detect the exposed light. The photoreceiver has multiple functions to detect automatically, by a kind of photoreceiver, light-uniform-rate of exposure of the light source, to perceive changes in the magnification of a projection lens, to calculate the parallel-degree of movement in the mask stage and the work-piece stage, and to calculate the focus-position of the projection lens.

9 Claims, 6 Drawing Sheets

PHOTORECEIVER HAVING MULTIPLE FUNCTIONS

BACKGROUND OF THE INVENTION

(1) Field of Invention

The present invention relates generally to a photoreceiver for light-exposure equipment, and more particularly, to a photoreceiver having multiple functions for assembling or reassembling equipment. These functions include automatically detecting, by a kind of photoreceiver, the light-uniform rate of exposure of a light source, perceiving changes in the magnification of a projection lens, calculating the parallel-degree in the moving of two stages, and calculating the focus-position of the projection lens.

(2) Description of Related Art

A conventional photoreceiver is shown in FIG. 1 and is described below.

FIG. 1 is a diagram illustrating the operating system of a conventional photoreceiver. The system includes a first stage 100 that accepts exposed light S1 and seats a mask, an image-forming-second stage 103 in which an image is formed, and an optical detecting part 102 that measures and controls the distribution of the intensity of the exposed light by moving right and left on the second stage 103. The system also includes a source of electric power (not shown).

When the source of electric power is operated by a user, the movement of the conventional photoreceiver according to the above composition begins. When the movement begins, the exposed light S1 comes in through the first stage 100 and forms an image on the second stage 103 through image-forming-lens 101. At the time, the optical detecting part 102 measures and control the distribution of the intensity of the exposed light by moving from left to right and then from right to left on the second stage 103.

In the conventional art, the system performs the following steps to position the work-piece at the focus-point of the projection lens when assembling or reassembling exposure equipment. The system determines the focus-point by repeatedly performing the same process of putting a work-piece at any point, exposing a light source, ascertaining the location of the focus-point by sight after the developing process, moving the work-piece toward the optical axis, exposing the light source again, and ascertaining the location of the focus point by sight after the developing process, etc.

Therefore, when operating an exposure equipment in practice, a work-piece is always located on the focus-point determined by the above process at every exposure time.

However, the conventional photoreceiver has several defects in that it accomplishes only one means to control the rate of exposure intensity as described above to keep it at uniform exposure. In addition, it is only possible to bring it into focus through repeated manual operation.

SUMMARY OF THE INVENTION

Therefore, an object of the present invention is to provide a photoreceiver which has multiple functions to detect automatically, by a kind of photoreceiver, light-uniform-rate of exposure of the light source, perception of changes in magnification of a projection lens, calculation of parallel-degree in moving of two stages and focus-position of the projection lens, in order to overcome the problems and disadvantages of the conventional devices.

To achieve the above purpose, according to the present invention, a photoreceiver having multiple functions, as embodied broadly defined herein, comprises a mask stage to accept the exposed light; a projection lens to form an image by accepting the above exposed light; a first mark to detect parallel-degree of the movement of two stages, which is paced on the above mask stage, and a second mask to measure the change of magnification by moving together the above first mark, and a mask on which a third mark is disposed to determine the focus point of the projection lens; a work-piece stage to form an image; a first optical detecting part, on which a fourth mark is disposed to assist the movement of the above first and second marks, to detect the exposed light by being placed on the above work-piece stage; and a second optical detecting part, on which a fifth mark is disposed to assist the movement of the above third mark and to detect the exposed light by being placed on the above work-piece stage.

DESCRIPTION OF THE PREFERRED EMBODIMENT

Figure 1:
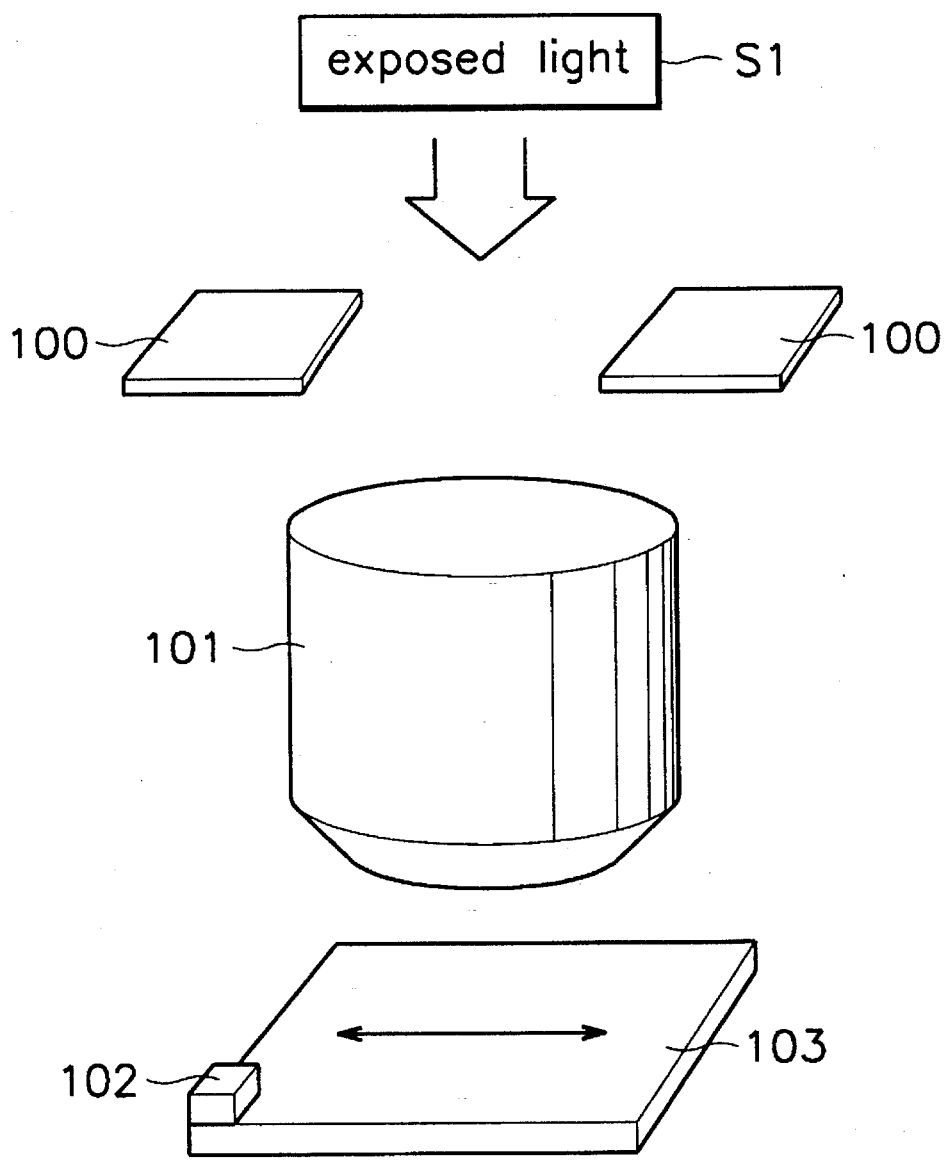
FIG. 1 is a diagram illustrating the operating system of a conventional photoreceiver.

Reference will now be made in detail to preferred embodiments of the invention, examples of which is illustrated in the accompanying drawings. Wherever possible, the same reference characters will be used throughout the drawings to refer to the same or like parts.

Figure 2:
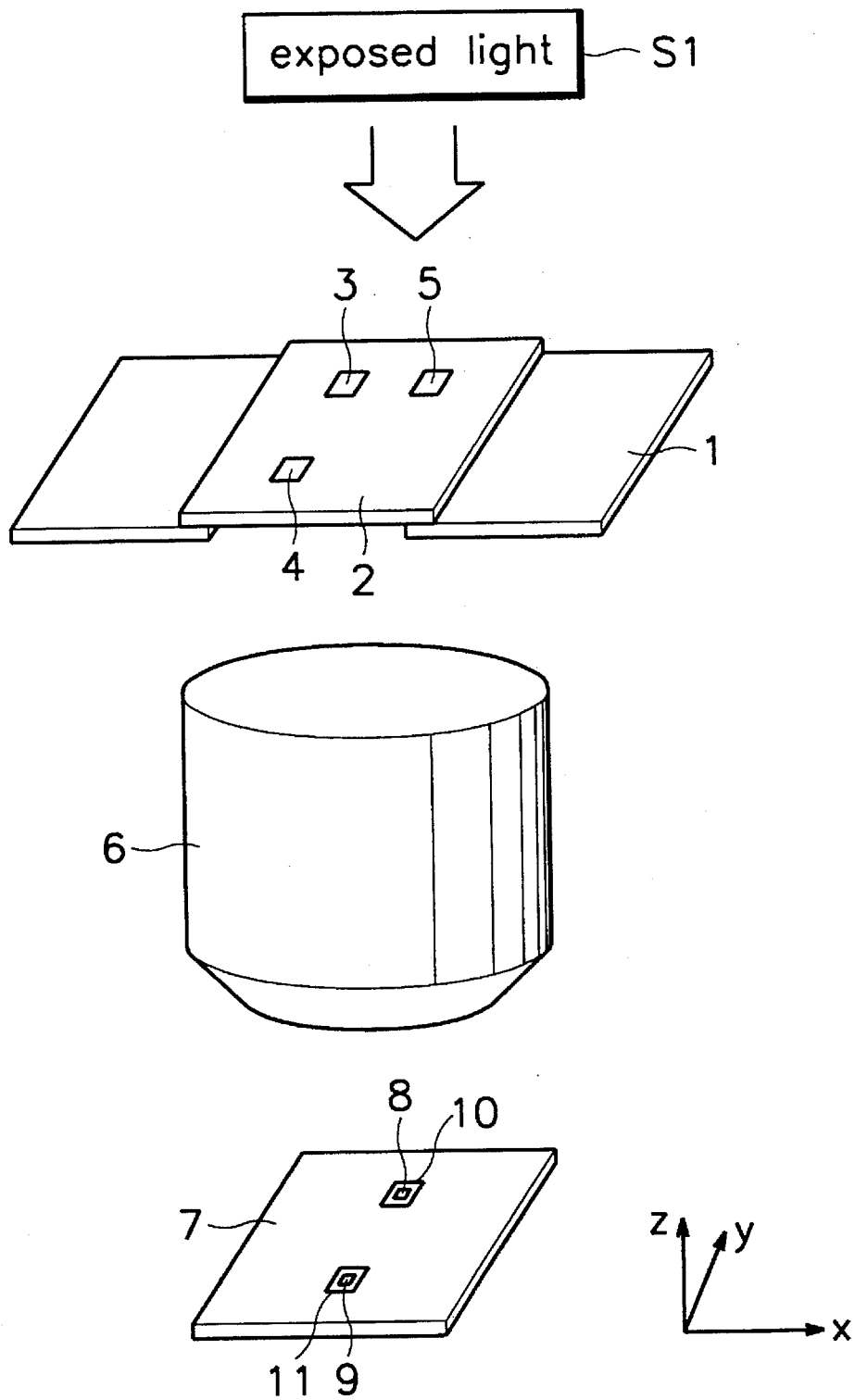
FIG. 2 is a perspective view of a photoreceiver having multiple functions according to a preferred embodiment of the present invention.
Figure 3:
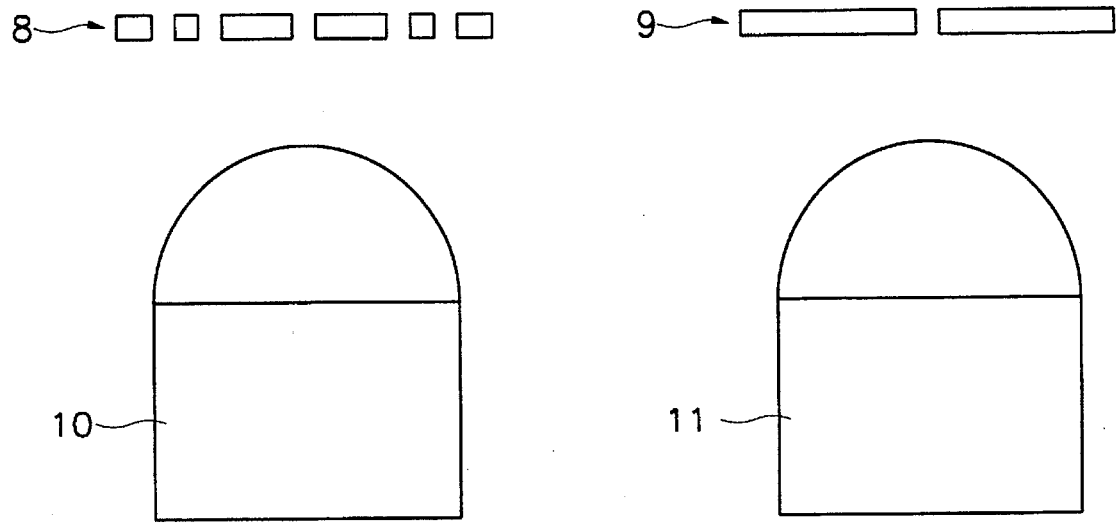
FIG. 3 is a detailed view illustrating an optical detecting part of a photoreceiver having multiple functions according to a preferred embodiment of the present invention.

FIG. 2 is a perspective view illustrating a photoreceiver having multiple functions according to a preferred embodiment of the present invention. FIG. 3 is a detailed view illustrating an optical detecting part of a photoreceiver having multiple functions according to a preferred embodiment of the present invention.

Figure 4:
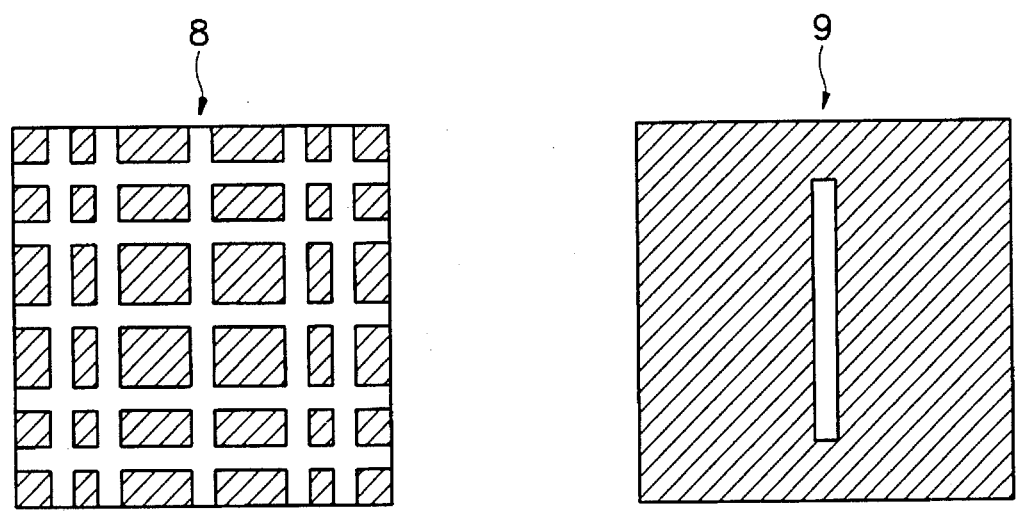
FIG. 4 is a detailed view illustrating the structure of a portion of the work-piece stage shown in FIG. 2.
Figure 5:
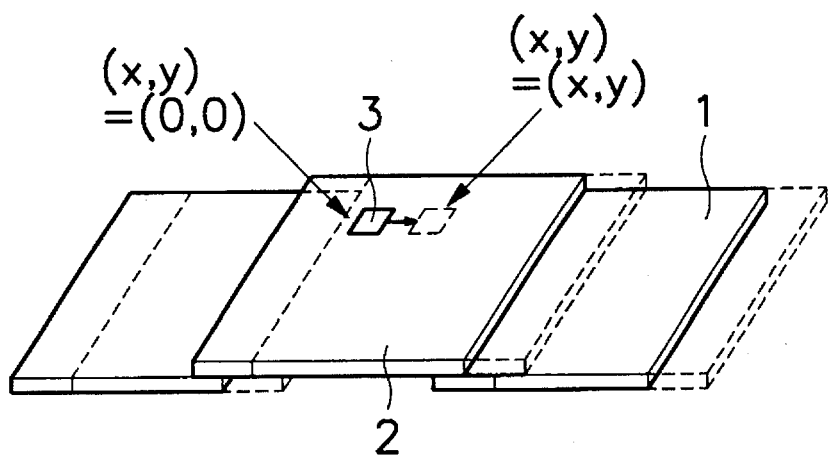
FIG. 5 is a detailed view illustrating a system to measure the parallel-degree of movement in two stages in a photoreceiver having multiple functions according to a preferred embodiment of the present invention.
Figure 5:
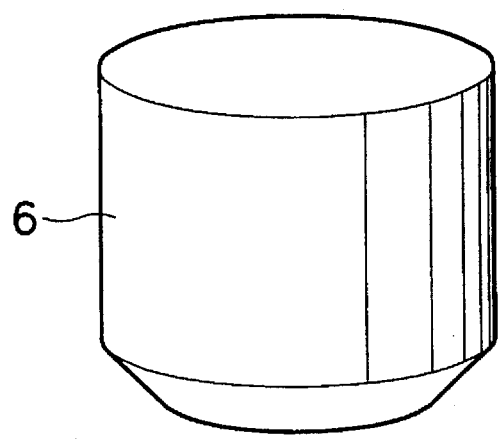
Figure 5:
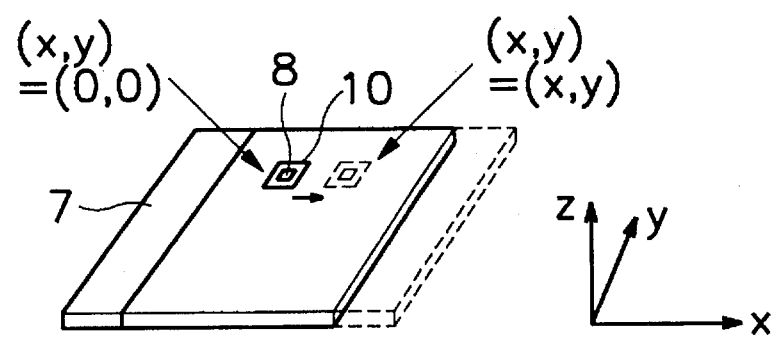
Figure 6:
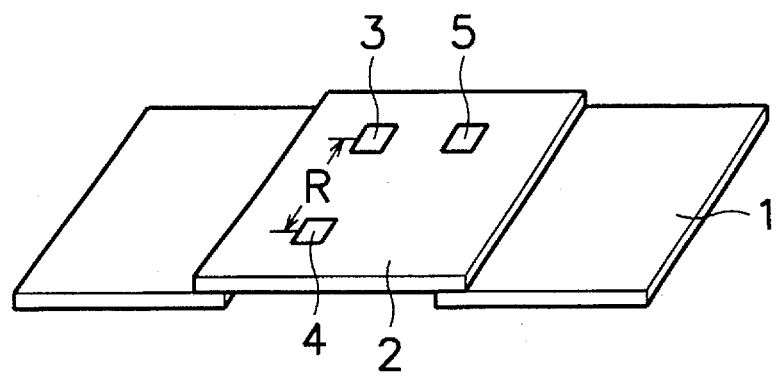
FIG. 6 is a detailed view illustrating a system to measure changes in magnification of a projection lens in a photoreceiver having multiple functions according to a preferred embodiment of the present invention.
Figure 6:
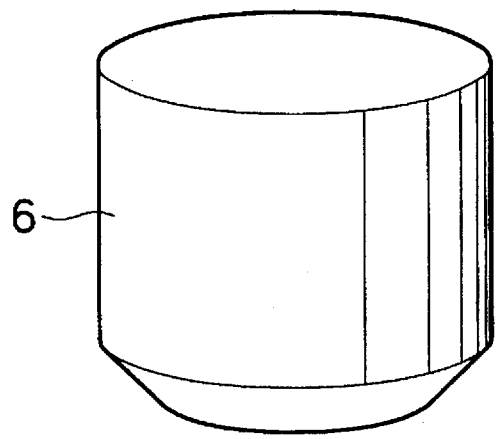
Figure 6:
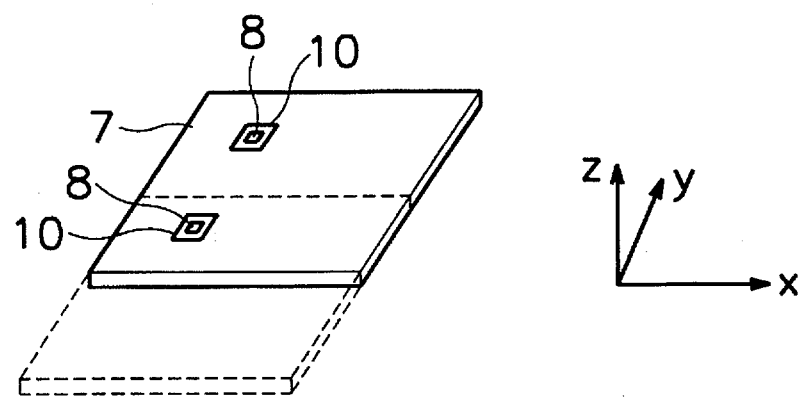

FIG. 4 is a detailed view illustrating the structure of a portion of the work-piece stage shown in FIG. 2. FIG. 5 is a detailed view illustrating a system to measure the parallel-degree movement of two stages in a photoreceiver having multiple functions according to a preferred embodiment of the present invention. FIG. 6 is a detailed view illustrating a system to measure changes in magnification of a projection lens in a photoreceiver having multiple functions according to a preferred embodiment of the present invention.

Figure 7:
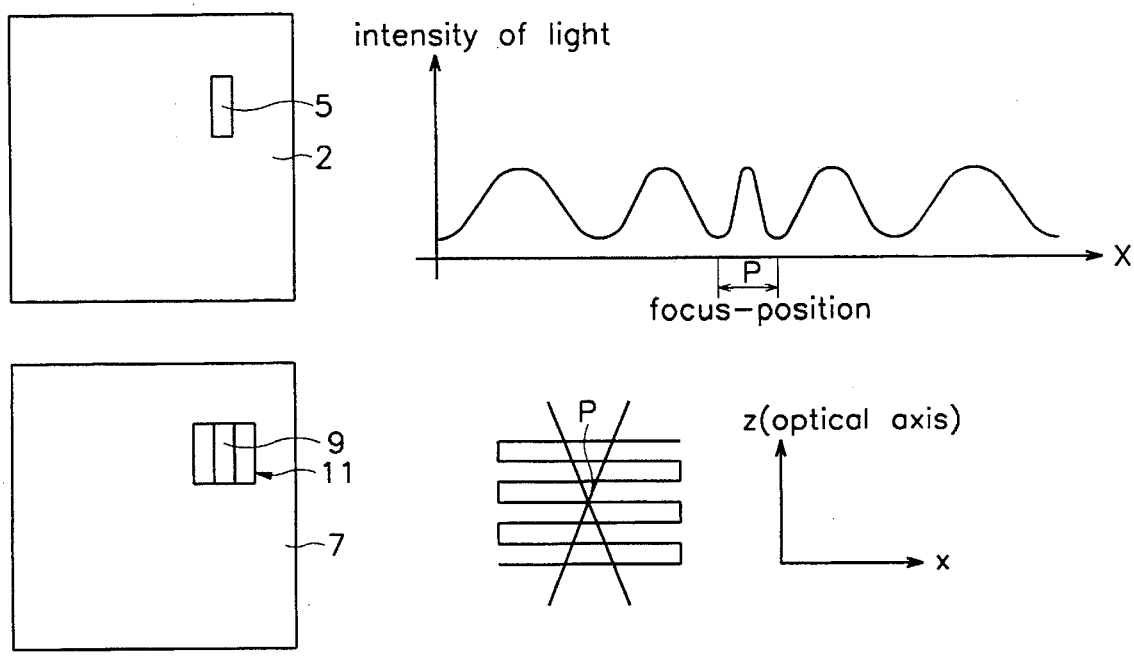
FIG. 7 is a detailed view illustrating a system to determine the focus-point of a projection lens in a photoreceiver having multiple functions according to a preferred embodiment of the present invention.
Figure 8:
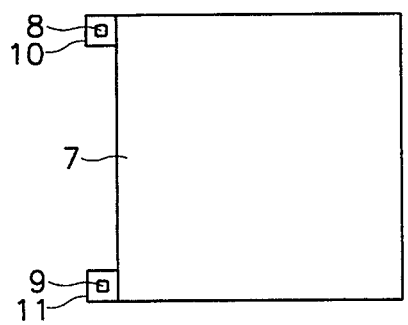
FIG. 8 is a diagram illustrating another composition of an optical detecting part in a photoreceiver having multiple functions according to a preferred embodiment of the present invention.
Figure 9:
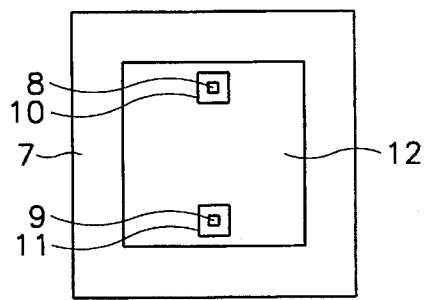
FIG. 9 is a diagram illustrating another composition of an optical detecting part in a photoreceiver having multiple functions according to a preferred embodiment of the present invention.

FIG. 7 is a diagram illustrating a system to determine the focus-point of a projection lens in a photoreceiver having multiple functions according to a preferred embodiment of the present invention. FIG. 8 is a diagram illustrating other compositions of an optical detecting part in a photoreceiver having multiple functions according to a preferred embodiment of the present invention. FIG. 9 is a diagram illustrating another composition of an optical detecting part in a photoreceiver having multiple functions according to a preferred embodiment of the present invention.

As illustrated in FIG. 2, the composition of a photoreceiver having multiple functions according to a preferred embodiment of the present invention is as follows.

A mask 2 is placed on a mask stage 1 to accept the exposed light S1. A first mark 3 is carved on the mask 2 to detect the parallel-degree of the movement of two stages. A second mark 4 is carved on the mask 2 to measure the change of magnification in a projection lens 6 by moving along with the first mark 3. A third mark 5 is carved on the mask 2 to determine the focus-point of a projection lens 6. A work-piece stage 7 is preferably placed under the mask stage 1.

A projection lens 6 is preferably placed between the mask stage 1 and the work-piece stage 7 to form an image on the work-piece stage by accepting the above exposed light S1 and focusing the exposed light S1 onto the work-piece stage 7. A first optical detecting part 10 and a second optical detecting part 11 are placed on the work-piece stage 7 to detect the exposed light S1. A fourth mark 8 is carved on the first optical detecting part 10 to assist movement of the first mark 3 and the second mark 4. A fifth mark 9 is carved on the second optical detecting part 11 to assist the movement of the third mark 5.

FIG. 3 illustrates the detailed structures of the first and second optical detecting parts 10 and 11, including the fourth mark 8 and the fifth mark 9. FIG. 4 illustrates the detailed structure of the fourth mark 8 and the fifth mark 9, carved on the parts 10 and 11, respectively.

As illustrated in FIG. 8, the work-piece stage 7 and the optical detecting parts 10 and 11 may be constructed in such a way that the first optical detecting part 10 and the second optical detecting part 11 are placed on the edge of the work-piece 7.

As illustrated in FIG. 9, the first optical detecting part 10 and the second optical detecting part 11 may be placed on work-piece stage 7, while the fourth 8 and the fifth mark 9 may be carved on an additional second mask 12, which is then placed on the work-piece stage 7.

The operation of a photoreceiver having multiple functions according to a preferred embodiment of the present invention by the above composition is explained below.

First, the preferred embodiment of the photoreceiver detects the intensity of the exposed light as follows. After removing the mask 2, which is placed on the mask stage 1, the photoreceiver detects the intensity of the exposed light by using only a first optical detecting part 10 and second optical detecting part 11 which are placed on the work-piece stage 7.

Second, the preferred embodiment of the photoreceiver measures the parallel-degree of movement in the mask stage 1 and work-piece stage 7 as follows. As illustrated in FIG. 5, the coordinates of two stages 1 and 7 are obtained by using the first mark 3 which is carved on mask 2, and the fourth mark 8 which is placed on the work-piece stage 7.

By disposing a projection lens 6 between the first mark 3 and the fourth mark 8, an image of the first mark 3 which is carved on mask 2 is formed on the fourth mask 8 of the work-piece stage 7. By rearranging the first mark 3 and the fourth mark 8, the relative coordinates of two stages are determined. The respective positions of the first mark 3 and the fourth mark 8 are determined by moving the mask 1 and the work-piece stage 7 to any place, rearranging them, and detecting changes of the light intensity in the first optical detecting part 10 according to the extent of overlap of first 3 and fourth marks 8. An example of how this may be done is described below.

Suppose that the coordinates of the mask stage 1 in the above system are (x,y)=(0,0), and those of the work-piece stage 7 are (X,Y)=(0,0). If the two stages 1 and 7 are moved by a constant distance, the relative coordinates of each stage 1 and 7 can be determined. At that time, the coordinates of the mask stage 1 are (x,y)=(a,b), and those of the work-piece stage 7 are (X,Y)=(A,B) according to the following equation:

$$\tan\theta = \frac{A-a}{B}$$

If $\tan\theta=0$ in the above equation, the two stages 1 and 7 are parallel with each other. If $\tan\theta$ is not equal to zero, the two stages 1 and 7 are not parallel with each other. Therefore, if the degree to which the two stages 1 and 7 are not parallel is given as the value of an offset, it can be used to compensate and always make the movement parallel.

Third, measurement of changes in magnification of the projection lens 6 is done as follows.

As illustrated in FIG. 6, to measure the parallel-degree of the movement of the above mask stage 1 and work-piece stage 7, the relative coordinates are determined by arranging the fourth mark 8 on the work-piece stage 7 with the first mark 3 on the mask 2. Then, the relative coordinates for the second mark 4 are determined by transferring the fourth mark 8 to a position under the second mark 4 on the mask 2 by moving the work-piece stage 7 again. Changes in magnification of the projection lens are perceived by comparing the moving-distance $R_m$ of the work-piece stage 7, which is shown by the above two coordinates, with the distance $R_d$ between the two marks 3 and 4 on the mask 2.

Fourth, determination of the focus-position of the projection lens 6 is performed as follows.

As illustrated in FIG. 7, the third mark 3 forms a image through the projection lens 6 after putting the work-piece stage 7 near the focus of the projection lens 6. At this time, if the work-piece stage 7 is scanned to the right, changes in the light intensity are obtained in a form of a sine curve from the second optical detecting part 11. Again, if the work-piece stage 7 is scanned to the left after moving a short distance in the optical axis Z, the width of the sort signal is changed. The scanning process is repeated until the position of the work-piece stage 7 is found that produces the minimum-width sort-signal. This position of the work-piece stage 7 is the focus-point P of the projection lens 6.

In the above photoreceiver having multiple functions, the movement of the work-piece stage 7 in the embodiment shown in FIG. 8 is the same with the embodiment shown in FIG. 2, which has different compositions of the optical detecting parts 10 and 11. At this time, the maximum transfer-distance of the work-piece stage 7 should be large.

In the above photoreceiver having multiple functions, the movement of the work-piece stage 7 used in the embodiment shown in FIG. 9 is the same as with the embodiment shown in FIG. 2, which has yet different compositions of the optical detecting parts 10 and 11. In this embodiment, the mask 2 must be placed on the mask stage 1, at the same time when the second mask 12 be placed on the work-piece stage 7. Also, the fourth mark 8 and fifth mark 9, which are carved on the second mask 12, should be placed exactly on the first optical detecting part 10 and second optical detecting part 11.

As described above, the present invention provides a photoreceiver which has multiple functions to automatically detect, by a kind of photoreceiver, light-uniform-rate of exposure of the light source, perceive changes in magnification of a projection lens, calculate the parallel-degree of movement of two stages, and calculate the focus-position of a projection lens.

What is claimed is:

1. A photoreceiver having multiple functions comprising:
   a mask stage, having a mask, for accepting exposed light and passing all or part of the exposed light through as masked light;
   a work-piece stage;
   a projection lens, having a focus point, for forming an image on the work-piece stage by accepting the masked light;
   a first mark on the mask for detecting a parallel-degree of movement of the mask stage and the work-piece stage;
   a second mark on the mask for measuring changes in magnification of the projection lens by moving together with said first mark;
   a third mark on the mask for determining the focus point of the projection lens;
   a first optical detecting part on the work-piece stage to detect the exposed light, a fourth mark on the first optical detecting part to assist the movement of said first and second marks; and
   a second optical detecting part on the work-piece stage to detect the exposed light, a fifth mark on the second optical detecting part to assist the movement of the third mark.

2. The photoreceiver of claim 1, wherein the first and second optical detecting parts are placed at the edge of the work-piece stage.

3. The photoreceiver of claim 1, wherein the first, second, and third marks are on the mask stage to produce a parallel-degree in movement of the mask stage and the working piece stage, to measure changes in magnification of a projection lens, and to determine the focus-position of the projection lens.

4. The photoreceiver of claim 1, wherein the maximum movement distance of work-piece stage is reduced by placing said first and second optical detecting parts at the center of said work-piece stage.

5. The photoreceiver of claim 1, wherein the first, second, and third marks which are separated from each other are used to adjust magnification, to measure parallel-degree of movement of the mask stage and the work-piece stage, and to determine the focus point of the projection lens.

6. The photoreceiver of claim 1, wherein said first and second marks includes a slit structure and photoreceiver to determine the focus point of the projection lens.

7. The photoreceiver of claim 1, wherein said mark and photoreceiver use a mark which includes a slit structure in an aperiodic arrangement and a photoreceiver to detect the parallel-degree in moving of stage to measure changes in magnification of the projection lens.

8. A photoreceiver having multiple functions comprising:
   a mask stage, having a first mask, for accepting exposed light and passing all or part of the exposed light through as masked light;
   a work-piece stage, having a second mask;
   a projection lens, having a focus point, for forming an image on the work-piece stage by accepting the masked light and focusing the masked light onto the work-piece stage;
   a first mark on the mask stage for detecting parallel-degree of movement of the mask stage and the work-piece stage;
   a second mark on the mask stage for measuring changes in magnification of the projection lens by moving together with the above first mark;
   a third mark on the mask stage for determining the focus point of the projection lens;
   a first optical detecting part on the work-piece stage to detect the exposed light;
   a fourth mark on the second mask to assist the movement of said first and second marks;
   a second optical detecting part on the work-piece stage to detect the exposed light; and
   a fifth mark on the second mask to assist the movement of the third mark.

9. A photoreceiver of claim 8, wherein the first and second optical detecting parts are at the edge of the work-piece stage and the fourth and fifth marks are on the edge of the second mask.

* * * * *